United States Patent
Lee et al.

(10) Patent No.: US 7,091,717 B2
(45) Date of Patent: Aug. 15, 2006

(54) SQUID SENSOR USING AUXILIARY SENSOR

(75) Inventors: Seung Min Lee, Yongin-si (KR); Heon Joo Lee, Seoul (KR); Byung Du Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 23 days.

(21) Appl. No.: 10/692,694

(22) Filed: Oct. 27, 2003

(65) Prior Publication Data

US 2005/0088174 A1   Apr. 28, 2005

(51) Int. Cl.
*G01R 33/35* (2006.01)
*G01R 33/25* (2006.01)

(52) U.S. Cl. ...................... 324/248; 324/225
(58) Field of Classification Search ............... 324/248, 324/249, 244, 243, 225, 207.12; 600/409; 326/5; 505/162
See application file for complete search history.

(56) References Cited

U.S. PATENT DOCUMENTS

| | | | | |
|---|---|---|---|---|
| 4,823,081 A | * | 4/1989 | Geisler | 324/225 |
| 5,113,136 A | * | 5/1992 | Hayashi et al. | 324/247 |
| 5,122,744 A | * | 6/1992 | Koch | 324/248 |
| 5,162,731 A | * | 11/1992 | Fujimaki | 324/248 |
| 5,187,436 A | * | 2/1993 | Mallick | 324/244 |
| 5,254,950 A | * | 10/1993 | Fan et al. | 324/322 |
| 5,331,278 A | * | 7/1994 | Evanson et al. | 324/232 |
| 5,343,707 A | * | 9/1994 | Sata | 62/6 |
| 5,642,045 A | * | 6/1997 | Keefe et al. | 324/244 |
| 5,894,220 A | * | 4/1999 | Wellstood et al. | 324/248 |
| 6,339,328 B1 | * | 1/2002 | Keene et al. | 324/248 |
| 6,462,540 B1 | * | 10/2002 | Kandori et al. | 324/248 |
| 6,538,436 B1 | * | 3/2003 | Simola et al. | 324/248 |

OTHER PUBLICATIONS

HJM ter Brake et al., limprovement of the Performance of a U-metal Magnetically Shielded Room by a Means of Active Compensation, 1991, Measured Science Technology, vol. 2, pp. 596-601.*

* cited by examiner

*Primary Examiner*—Edward Lefkowitz
*Assistant Examiner*—Kenneth J. Whittington
(74) *Attorney, Agent, or Firm*—Birch, Stewart, Kolasch & Birch, LLP (57) ABSTRACT

A SQUID (Superconducting QUantum Interference Device) sensor using an auxiliary sensor, includes a SQUID sensing unit having a SQUID and a first feedback coil for creating a magnetic field at a periphery of the SQUID; an auxiliary sensor having a lower magnetic sensitivity and a higher operation range than the SQUID sensing unit; and a sensor reading unit for operating the SQUID sensing unit and the auxiliary sensor to read out a signal of the SQUID and at the same time, supplying the SQUID sensing unit with an offset magnetic field through the first feedback coil.

16 Claims, 5 Drawing Sheets

SQUID SENSOR USING AUXILIARY SENSOR

BACKGROUND OF THE INVENTION

1. Field of the Invention

The present invention relates to a SQUID (Superconducting QUantum Interference Device), and more particularly, to a SQUID sensor using an auxiliary sensor.

2. Description of the Related Art

Generally, SQUID is a device that uses the quantum interference effect and the Josephson effect of magnetic flux to respond to a variation of a weak magnetic field, and is used for a high sensitive magnetic sensor or biosensor. The SQUID has a measurement sensitivity of several $fT/Hz^{1/2}$ when a low temperature superconductor is used, and several tens of $fT/Hz^{1/2}$ when a high temperature superconductor is used.

However, the method using the SQUID has three drawbacks as follows.

1) One of them is a relationship between a Signal/Noise (S/N) ratio and an operation range. In other words, in principle, the SQUID can be used to design a driving circuit having a large S/N ratio such that the operation range can be wider, but since the sensitivity of the SQUID is degraded in a real circumstance due to influences of geomagnetic field generated in a general circumstance or magnetic field of a magnetic source, the S/N ratio is not increased as much as the operation range is increased. This is because the intensity of the geomagnetic field in the general circumstance is several tens of $\mu T/Hz^{1/2}$, and the intensity of the geomagnetic field is only several $mT/Hz^{1/2}$ according to a distance from a power supply or a distance from the magnetic source such as an electro-magnetic equipment, a car, etc.

The influences of various magnetic sources in the general circumstance can be excluded by a method of shielding the influences of the geomagnetic field or the magnetic source when the SQUID is cooled. However, a conventional shielding method using a multi-layered magnetic shield material has a drawback in that a high shielding cost is required and an ideal shielding is difficult due to a phenomenon that a magnetized amount resulted from a slow variation of the geomagnetic field or the magnetic field in a refrigerator driving unit is slowly varied, thereby causing a difficulty in an exact signal analysis in the SQUID.

2) Since the SQUID can be used at a temperature below 77K when the conventional superconductor is used, its use is possible only when refrigerant such as liquid nitrogen is used. That is, in order to use the SQUID for the purpose of a general usage or in a state of distant installation, it is essential to use the refrigerator that can continuously or frequently maintain a low temperature state without a periodical refrigerant supplement.

However, when the refrigerator is driven, the refrigerator itself generates a very large magnetic field. In case a general cryogenic refrigerator is used, since the intensity of the generated magnetic field reaches a level at which a property of the superconductor constituting the SQUID is deteriorated so that performance of the SQUID is remarkably deteriorated, the refrigerator should be used at a distance far from the SQUID. However, such a use causes the cooling efficiency to be abruptly dropped, so that the SQUID cannot be used in an appropriately state.

3) A conventional SQUID has a drawback in that since the SQUID has a different operation current in every device, the SQUID frequently shows a minute variation depending on a magnetic shield condition while a cooling process is performed using the refrigerator. That is, in appliance in the general circumstance using the refrigerator, even in the magnetic shield condition, since the magnetic field is rapidly varied at the time of initial cooling and resetting to degrade the sensitivity of the SQUID, the conventional SQUID has a drawback in that the self-noise of the SQUID is increased due to degradation of a material constituting the SQUID.

To solve the drawback of the self-noise increase, a fluxback setting method for allowing the magnetic flux applied to the SQUID to be constant is proposed to prevent a large magnetic field from being applied while the SQUID is normally operated. However, the SQUID using the fluxback setting method has a drawback in that an abnormal operation is caused by overload and at the time of resetting, a large variation in the magnetic field is caused in an instant and in most cases, magnetic flux is trapped in the SQUID at this moment, so that the SQUID is deviated from an optimal condition and noise is increased.

Accordingly, in order to overcome the above-described drawback of the noise increase, proposed is a method of using the auxiliary sensor operating in a relatively large magnetic field and at a room temperature to apply an offset magnetic field to the SQUID. Since the SQUID using the above method senses only a difference between a signal of the auxiliary sensor and its peripheral signal, the deterioration drawback in the sensitivity of the SQUID can have been solved.

However, the above-described conventional SQUID has a drawback in that since the auxiliary sensor has generally much more poor sensitivity than the SQUID, the noise of the auxiliary sensor is mixed with the offset magnetic field, so that a signal for measurement cannot be detected. Finally, this corresponds to the measurement using the sensitivity of the auxiliary sensor, so that the use of the SQUID is meaningless.

To solve the above drawbacks, the following methods are proposed.

One is a method in which an identical offset magnetic field is applied to a gradiometer including two SQUIDs disposed spatially apart from each other and the noise of the auxiliary sensor is offset by an output difference between two SQUIDs to measure a spatial variation of the magnetic field as the sensitivity of the SQUID. However, the conventional method has a drawback in that the gradiometer cannot obtain a magnitude variation of the magnetic field itself.

Another is a method in which an output of the auxiliary sensor is periodically digitalized to form the offset magnetic field and thereby prevent noise from being continuously applied. However, the method also has a drawback in that a separate logic circuit is needed for processing an instant offset magnetic field when the offset magnetic field is formed using a low noise current periodically digitalized, and the abrupt variation of the magnetic field does not provide an offset effect.

SUMMARY OF THE INVENTION

Accordingly, the present invention is directed to a SQUID sensor using an auxiliary sensor that substantially obviates one or more problems due to limitations and disadvantages of the related art.

An object of the present invention is to provide a SQUID sensor using an auxiliary sensor, in which an offset magnetic field having a noise level higher than a self-noise level of the SQUID is formed to prevent the sensitivity of the SQUID from being degraded depending on rapid variation of magnetic field.

Another object of the present invention is to provide a SQUID sensor using an auxiliary sensor, having a significantly improved signal to noise (S/N) ratio of a SQUID driving circuit.

A further object of the present invention is to provide a SQUID sensor using an auxiliary sensor, in which the generation of an additional noise is prevented due to use of the auxiliary sensor.

A further another object of the present invention is to provide a SQUID sensor using an auxiliary sensor, in which a performance degradation of a SQUID is minimized when a refrigerator is used.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a SQUID (Superconducting QUantum Interference Device) sensor using an auxiliary sensor, including: a SQUID sensing unit having a SQUID and a first feedback coil for creating a magnetic field at a periphery of the SQUID; an auxiliary sensor having a lower magnetic sensitivity and a higher operation range than the SQUID sensing unit; and a sensor reading unit for operating the SQUID sensing unit and the auxiliary sensor to read out a signal of the SQUID and at the same time, supplying the SQUID sensing unit with an offset magnetic field through the first feedback coil.

Herein the sensor reading unit includes: a SQUID driving unit for driving the SQUID sensing unit to read out an output signal of the SQUID; an auxiliary sensor driving unit for driving the auxiliary sensor to read out the output signal of the SQUID; and a first combining unit for combining magnetic fields generated from the SQUID driving unit and the auxiliary sensor driving unit to supply the SQUID sensing unit with combined magnetic field as the offset magnetic field through the first feedback coil.

Further, the SQUID sensor using the auxiliary sensor additionally includes a refrigerator for continuously or frequently maintaining the SQUID sensing unit in a low temperature.

Furthermore, the SQUID sensor using the auxiliary sensor additionally includes a second combiner for combining an output of the auxiliary sensor with an output of the SQUID sensing unit to output a noise-eliminated signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The present invention uses an arbitrary magnetic sensor having a poor performance whereas having a large input range comparing with a SQUID to form an offset magnetic field having a noise level higher than a self-noise level of the SQUID, such that the offset magnetic field can cause a noise-eliminated output to be provided to thereby easily embody a SQUID appliance in a general magnetic field. Together with this, in a first embodiment using the arbitrary magnetic sensor, a method is proposed for preventing a performance degradation of the SQUID from the magnetic field generated at the refrigerator as a key element of the SQUID.

Figure 1:
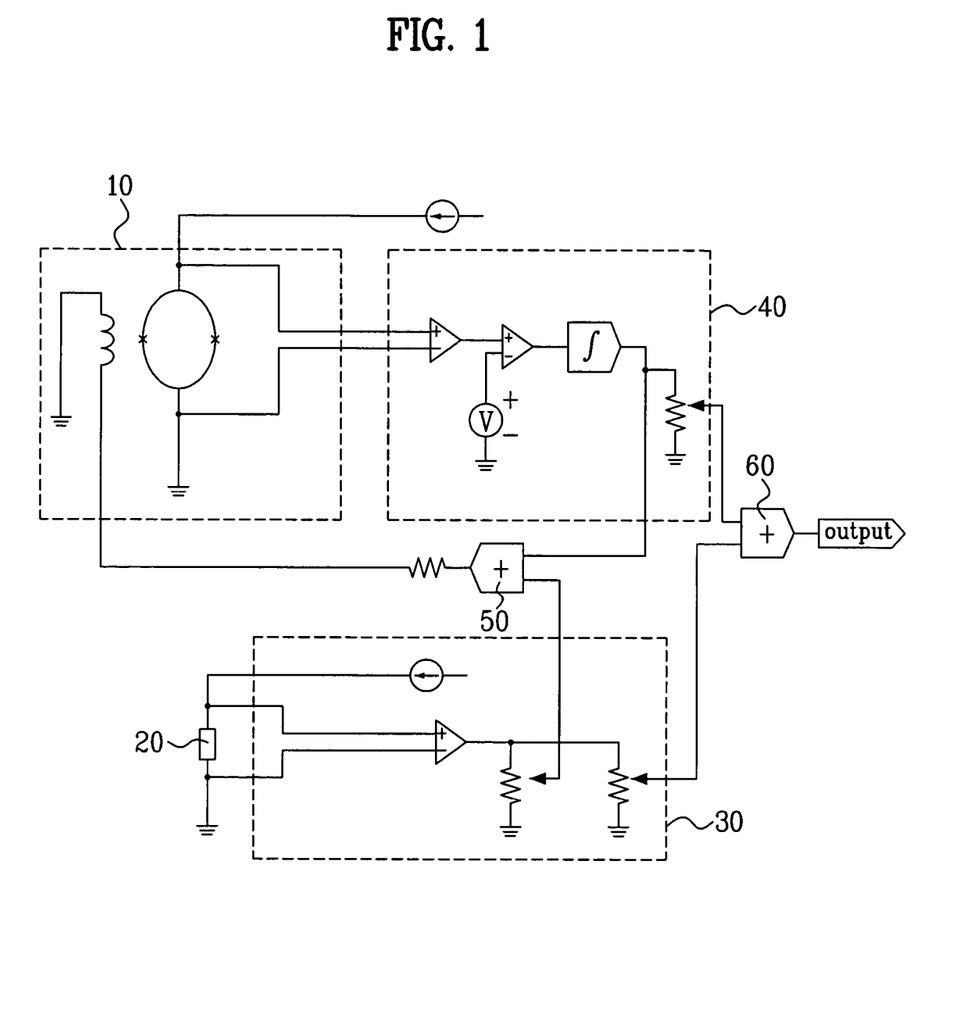
FIG. 1 is a circuit diagram illustrating a SQUID sensor using an auxiliary sensor according to a first embodiment of the present invention.

FIG. 1 is a circuit diagram illustrating a SQUID sensor using an auxiliary sensor according to a first embodiment of the present invention.

Referring to FIG. 1, the SQUID sensor using the auxiliary sensor includes a SQUID sensing unit 10 comprised of the SQUID and a feedback coil for creating a magnetic field at a periphery of the SQUID; an auxiliary sensor 20 having a lower magnetic sensitivity and a higher operation range than the SQUID sensing unit 10; a SQUID driving unit 40 for driving the SQUID sensing unit 10 to read out an output signal of the SQUID; an auxiliary sensor driving unit 30 for driving the auxiliary sensor 20 to read out the output signal of the SQUID; a first combining unit 50 for combining the magnetic fields generated through the SQUID driving unit 40 and the auxiliary sensor driving unit 30 to supply the SQUID sensing unit 10 with the combined magnetic field as an offset magnetic field through the feedback coil; and a second combining unit 60 for combining an output of the auxiliary sensor 20 and an output of the SQUID sensing unit 10 to output a noise-eliminated signal therefrom.

The first combining unit 50 uses the output of the auxiliary sensor 20 to supply the SQUID with the offset magnetic field. At this time, since a component caused by a noise of the auxiliary sensor 20 is together inputted to the SQUID, the second combining unit 60 allows a magnetic field value detected by the auxiliary sensor 20 to be included in the output signal of the SQUID by a predetermined ratio having a negative value. The ratio is represented by multiplying a gain of the SQUID driving unit 40 by combination constants of the SQUID and the feedback coil.

Further, if the output of the SQUID is added with the output of the auxiliary sensor driving unit 30, which is obtained by multiplying the same ratio having an opposite sign to the output of the SQUID, the noise caused by the auxiliary sensor 20 is eliminated from the output of the SQUID.

Actually, the noise caused by the auxiliary sensor 20 is not perfectly eliminated due to a phase shift of the SQUID driving unit 40, but if the SQUID driving unit 40 is designed to provide a small phase shift, a power supply signal, etc. having a relative low frequency has an elimination ratio significantly increased.

For this, a more detailed description is as follows.

Assuming that the magnetic field at the periphery of the auxiliary sensor 20 is "Bs", the magnetic field at a periphery of the SQUID is "$B_0$", the output of the auxiliary sensor is "Vs", and the noise of the auxiliary sensor is "Vn", an output magnetic field of the auxiliary sensor Vs(Bs) can be expressed as follows.

$$Vs(Bs)=Ve(Bs)+Vn \quad (1)$$

Herein, "Ve(Bs)" is a value obtained by a magnetic field-to-output characteristic of the auxiliary sensor, and assuming a linearity of the auxiliary sensor, an equation of Ve=aBs is obtained.

On the other hand, assuming that an output function of the SQUID driving unit 40 is "$V_0(B)$", the magnetic field ($B_1$) applied to the SQUID is expressed as in the following equation (2).

$$B_1=B_0-M(V_0(B_1)+Vs(Bs))/R_{FB}=(B_0-BsaM/R_{FB})-M(V_0(B_1)+Vn)/R_{FB} \quad (2)$$

Herein, "M" is a current-to-output magnetic field coefficient of the feedback coil.

Additionally, if the auxiliary sensor 20 is enough close to the SQUID, since the equation of Bo=Bs+ΔB is obtained, when a flux-back driving is not performed, that is, when $V_0(B)=0$, the SQUID senses only magnetic field corresponding to $\Delta B+(1-aM/R_{FB})Bs-MVn/R_{FB}$. At this time, control is performed to meet $aM/R_{FB} \approx 1$, an equation of $B_1 \approx \Delta B$ is obtained.

On the other hand, when the SQUID is driven, the auxiliary sensor driving unit 30 offsets the magnetic field by ΔB, and the output of the SQUID is expressed as in the following equation (3).

$$V_0(\Delta B+(1-aM/R_{FB})Bs-MVn/R_{FB}) \quad (3)$$

Additionally, since the SQUID driving unit 40 has an excellent linearity to express an output function of the SQUID driving unit 40 as $V_0(B)=bB$, it is expressed as in the following equation (4).

$$V_0=b\Delta B+b(1-aM/R_{FB})Bs-bMVn/R_{FB} \quad (4)$$

Herein, a final output (Vf) obtained by adding a value obtained by multiplying a c value by an output (Vs) of the auxiliary sensor 20 is expressed as in the following equation (5).

$$\begin{aligned} Vf &= b\Delta B + b(1-aM/R_{FB})Bs - bMVn/R_{FB} + caBs + cVn \\ &= b(B_0-Bs) + b(1-aM/R_{FB})Bs - bMVn/R_{FB} + caBs + cVn \\ &= bB_0 + (ca-baM/R_{FB})Bs + (c-bM/R_{FB})Vn \end{aligned} \quad (5)$$

At this time, if an equation of $bM/R_{FB}=c$ is exactly allowed, an equation of $Vf=bB_0+(ca-ca)Bs=bB_0=V_0(B_0)$ is obtained. Additionally, even in case the auxiliary sensor 20 does not perfectly have the linearity, if an equation of $bM/R_{FB}=c$ is allowed in an equation of $Vf=b\Delta B+bBs-Ve(Bs)M/R_{FB}-bMVn/R_{FB}+cVe(Bs)+cVn$, an equation of $Vf=V_0(B_0)$ is obtained.

Accordingly, the final output (Vf) is the same as the output value of the SQUID driving unit 40 in the magnetic field $B_0$ without the offset magnetic field caused by the auxiliary sensor. At this time, the magnetic field applied to the SQUID is expressed as $\Delta B+(1-aM/R_{FB})Bs-MVn/R_{FB}$, and since it can be formed enough smaller than $B_0$, the sensitivity degradation of the SQUID caused by a large magnetic field can be prevented. For example, since a term of $(1-aM/R_{FB})Bs$ cannot always have a value of 0 due to its non-linear characteristic in a general auxiliary sensor driving unit 30, it is desirable that a linearized circuit is constructed.

Herein, in a conventional method using the offset magnetic field, the final output is allowed to have a smaller value than a value obtained by an actual magnetic field. However, in the present invention, since the final output is allowed to be the same as a value obtained when the offset magnetic field is not provided through the second combining unit 60, the SQUID driving unit 40 having not large S/N ratio is used to obtain the output with the large S/N ratio.

Generally, in most cases, the feedback coil of the SQUID is integrated together with the SQUID. At this time, since the integrated feedback coil does not constantly maintain a total sum of the magnetic field perfectly applied to the SQUID, but generally constantly maintains a sum of the magnetic flux, the offset magnetic field caused by the auxiliary sensor cannot be maintained as a constant magnetic field at all parts of the SQUID, and induces a gradient component of the magnetic field. In this case, when the offset magnetic field is a large value, since a gradient is also large to thereby degrade the shield effect of the SQUID, this degradation is solved through the auxiliary sensor, as shown in FIG. 1.

Figure 2:
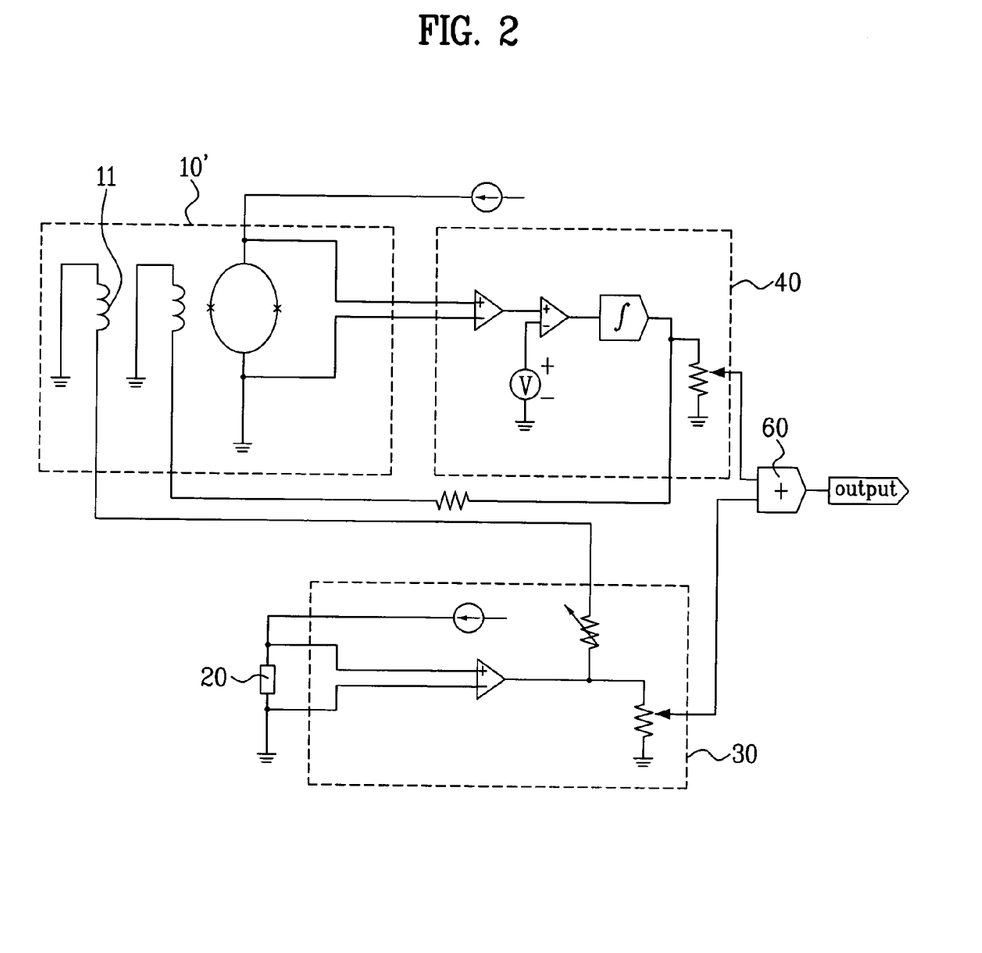
FIG. 2 is a circuit diagram illustrating a SQUID sensor using an auxiliary sensor according to a second embodiment of the present invention.
Figure 3:
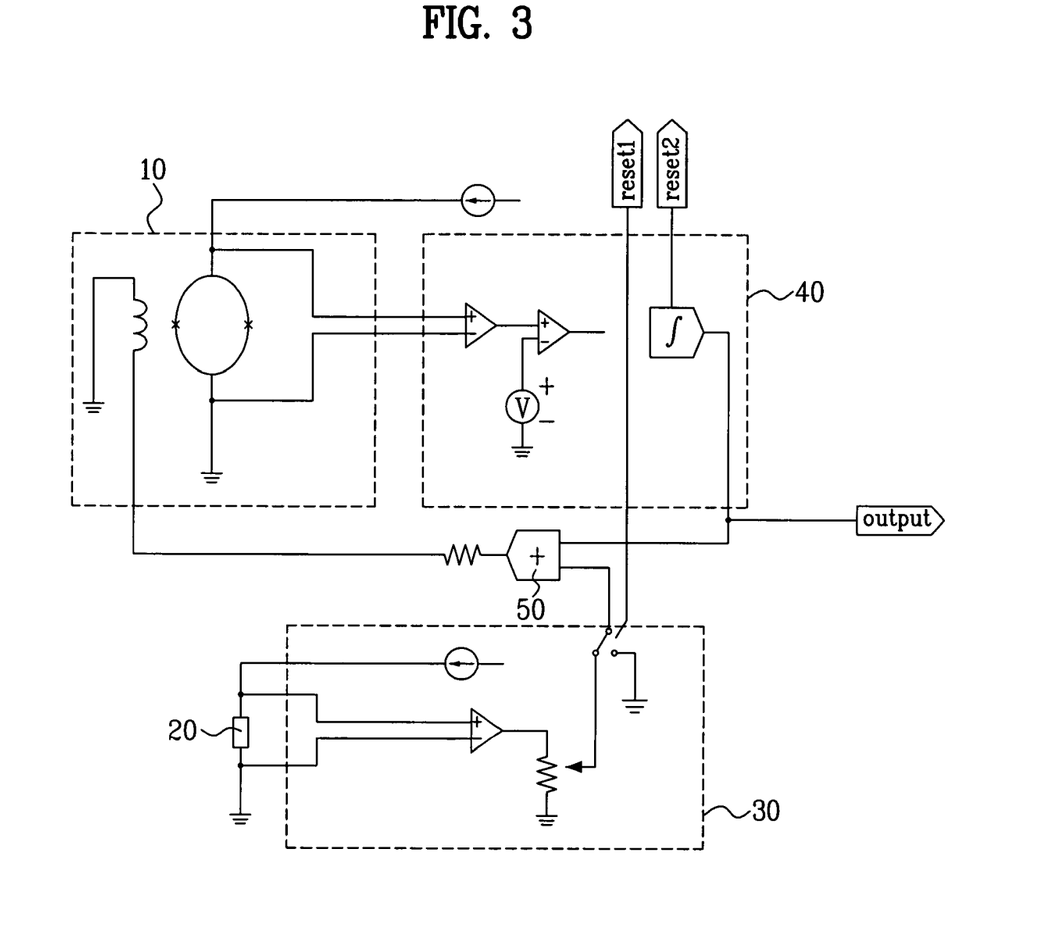
FIG. 3 is a circuit diagram illustrating a SQUID sensor using an auxiliary sensor according to a third embodiment of the present invention.

FIGS. 2 and 3 are circuit diagrams illustrating SQUID sensors using the auxiliary sensors according to second and third embodiments of the present invention.

FIG. 2 illustrates a case in which a separate feedback coil 11 for forming a regular magnetic field such as a Helmholtz coil is added to the SQUID sensor of FIG. 1.

On the other hand, a method for preventing the rapid variation of the magnetic field to prevent the sensitivity degradation at the time of initial cooling and resetting can be also constructed as shown in FIG. 3.

That is, in FIG. 3, the offset magnetic field caused by the auxiliary sensor 20 enables at the time of cooling as shown in FIG. 1, and when a separate reset value is applied to be over a specific value, the SQUID is protected by the auxiliary sensor 20. Additionally, external signals (reset 1) and (reset 2) are differentiated on a time to apply the offset magnetic field, and then allows a reset of the auxiliary sensor driving unit 30. At this time, if the magnetic field value is monitored using the auxiliary sensor 20 in a reset state while belonging to a safe operation range, the SQUID driving unit 40 is operated and the offset magnetic field is eliminated to be in a normal operation state.

In this method, the auxiliary sensor driving unit 30 itself should have the large S/N ratio, and during resetting, the SQUID driving unit 40 should not be operated. Accordingly, the method has a great advantage in that an exact control is not needed to eliminate the noise effect of the auxiliary sensor.

On the other hand, a method for preventing the performance degradation of the SQUID from the magnetic field generated at the refrigerator being a key element of the SQUID will be described with reference to the attached drawings.

Figure 4:
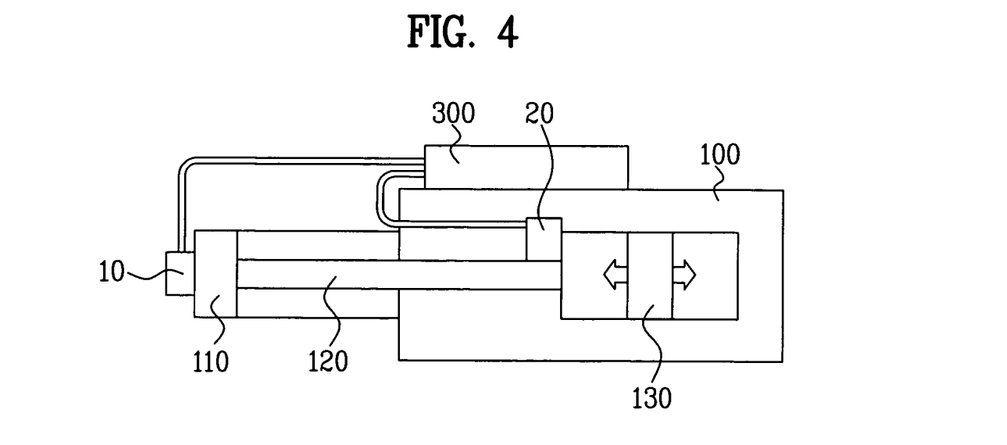
FIG. 4 is a schematic diagram illustrating a SQUID sensor using an auxiliary sensor with a refrigerator according to a fourth embodiment of the present invention.

FIG. 4 is a schematic diagram illustrating the SQUID sensor using the auxiliary sensor with the refrigerator according to a fourth embodiment of the present invention.

As shown in FIG. 4, the SQUID sensor includes a SQUID sensing unit 10 comprised of the SQUID and a feeback coil for creating the magnetic field in a periphery of the SQUID; a low-priced auxiliary sensor 20 having a magnetic sensitivity less than the SQUID sensing unit 10, but having a large operation range; a sensor reading unit 300 for operating the SQUID sensing unit 10 and the auxiliary sensor 20 to read out an output signal of the SQUID; and a refrigerator 100 for continuously or frequently maintaining the low temperature.

The refrigerator 100 includes a motor unit 130 comprised of a permanent magnet and a fixed electro-magnet; a coolant 120 for moving a low temperature atmosphere caused by the motor unit 130; and a cold end 110 for transmitting the coolant 120 to the SQUID sensing unit 10 to maintain the low temperature. Herein, the auxiliary sensor 20 is disposed close to the motor unit 130, and the SQUID sensing unit 10 is disposed distant from the motor unit 130.

At this time, the magnetic field formed by the motor unit 130 of the refrigerator 100 is generated by a mobile permanent magnet (or electro-magnet) and a fixed electro-magnet (or permanent magnet). Herein, it is characterized that the generated magnetic field has a very large magnitude near the motor unit 130, and has a rapidly reduced magnitude as being distant away from the motor unit 130.

By using the above characteristic, the auxiliary sensor 20 is disposed near the motor unit 130, and the auxiliary sensor 20 determines a position of the permanent magnet (or electro-magnet) or a maximum value of the magnetic field formed by the electromagnet.

Additionally, the auxiliary sensor 20 generates the offset magnetic field to be applied to the SQUID sensing unit 10 as much as the magnetic field generated at the motor unit 130 from the maximum value of the determined magnetic field. Preferably, a lookup table method can be used to determine the magnitude of the magnetic field. If doing so, the SQUID sensing unit 10 can be allowed to significantly reduce the influence of the magnetic field generated from the motor unit 130 due to the magnetic field generated from the auxiliary sensor 20.

Figure 5:
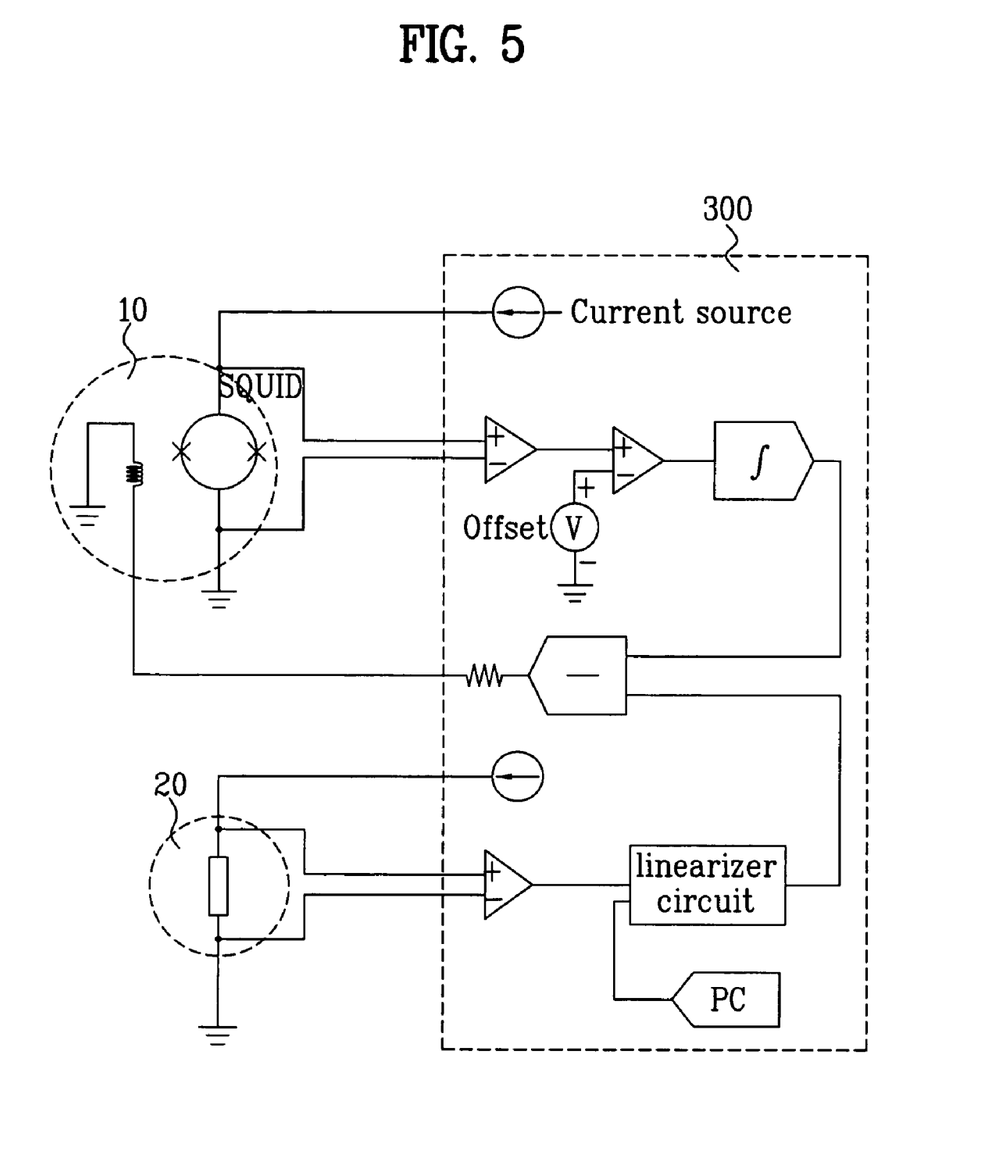
FIG. 5 is a detailed diagram illustrating a SQUID sensor using an auxiliary sensor with a refrigerator according to a fourth embodiment of the present invention.

FIG. 5 is a detailed diagram illustrating the SQUID sensor using the auxiliary sensor with the refrigerator according to a fifth embodiment of the present invention.

As shown in FIG. 5, the SQUID sensor includes a SQUID sensing unit 10 comprised of the SQUID and a feedback coil for creating a magnetic field at a periphery of the SQUID; a low-priced auxiliary sensor 20 having a magnetic sensitivity less than the SQUID sensing unit 10, but having the large operation range; a sensor reading unit 300 for operating the SQUID sensing unit 10 and the auxiliary sensor 20 to read out a signal of the SQUID and at the same time, supplying the SQUID sensing unit 10 with the offset magnetic field through the feedback coil; and a refrigerator (not shown) for continuously or frequently maintaining the SQUID sensing unit 10 to be in the low temperature outside.

At this time, the sensor reading unit 300 uses a flux-locked-loop (FLL) as a basic circuit for driving the SQUID, and reads out the magnetic field value generated at the motor unit 130 from the auxiliary sensor 20 to generate a predetermined magnitude of the offset magnetic field.

Since the magnetic field read out using the auxiliary sensor 20 is a value read from the magnetic field generated from the motor unit 130 at a position of the auxiliary sensor 20, in order to obtain the magnetic field value till the position of the SQUID sensing unit 10 from the above value, a method is used for directly calculating a relation formula considering a geometric element, or the lookup table is obtained to formularize a mathematic function such that the signal of the motor unit 130 measured at the position of the SQUID sensing unit 10 is minimized through several experiments.

Additionally, in real time, a value is obtained by calculating the magnetic field generated at the motor unit 130 from the auxiliary sensor 20, and the obtained value is combined with a signal value of the SQUID generated by the operation of the SQUID sensing unit 10. The combined value is applied as the offset magnetic field to the SQUID sensing unit 10 through the FLL being the feedback coil such that the magnetic field caused by the motor unit 130 is offset.

At this time, as described in the conventional art, the SQUID sensing unit 10 generates a vibration as well as the magnetic field caused by the motor unit 130. If the SQUID sensing unit 10 generates the vibration even in the regular magnetic field such as the geomagnetic field, since the magnetic field value applied to the SQUID is varied, it is not easy to calculate the magnetic field value.

In a method for solving this, if the auxiliary sensor 20 is disposed near the SQUID sensing unit 10, an amount such as a current for allowing the auxiliary sensor simply to function as a null sensor is applied to the feedback coil of the SQUID sensing unit 10.

However, at this time, since a self-magnetic noise is generated from the auxiliary sensor 20 to be applied to the SQUID sensing unit 10, the conventional SQUID has a disadvantage in that the sensitivity of the SQUID sensing unit 10 becomes the same as the sensitivity of the auxiliary sensor 20. This is not efficient in that the good sensitivity of the SQUID sensor is caused to use as the bad sensitivity of the auxiliary sensor. Accordingly, the conventional method can obtain such an effect only in case the gradiometer is constructed not to purpose the high sensitivity.

To the contrary, in the inventive method, the sensor reading unit 300 corresponding to the auxiliary sensor 20 in FIG. 5 reads out a signal of the auxiliary sensor 20 having a larger magnetic field generated at the motor unit 130 than from the SQUID sensing unit 10. Additionally, the read signal is used to form the offset magnetic field at the SQUID sensing unit 10. Through a linearizer, a more attenuated signal than the signal read out by the auxiliary sensor 20 is outputted. Accordingly, the more attenuated noise than the self-noise of the auxiliary sensor 20 is applied to the SQUID sensing unit 10.

Preferably, the positions of the SQUID sensing unit 10 and the auxiliary sensor 20 are determined such that the magnetic field strength at the motor unit 130 is one thousand times that at the SQUID sensing unit 10. At this time, assuming the self-noise 100 pT/Hz$^{1/2}$ of the auxiliary sensor at the present technology level of a self-resistance sensor, the offset magnetic field having the noise of 100 fT/Hz$^{1/2}$ at the present technology level of a high temperature superconducting SQUID is the same as a result obtained by applying the offset magnetic field.

Figure 6:
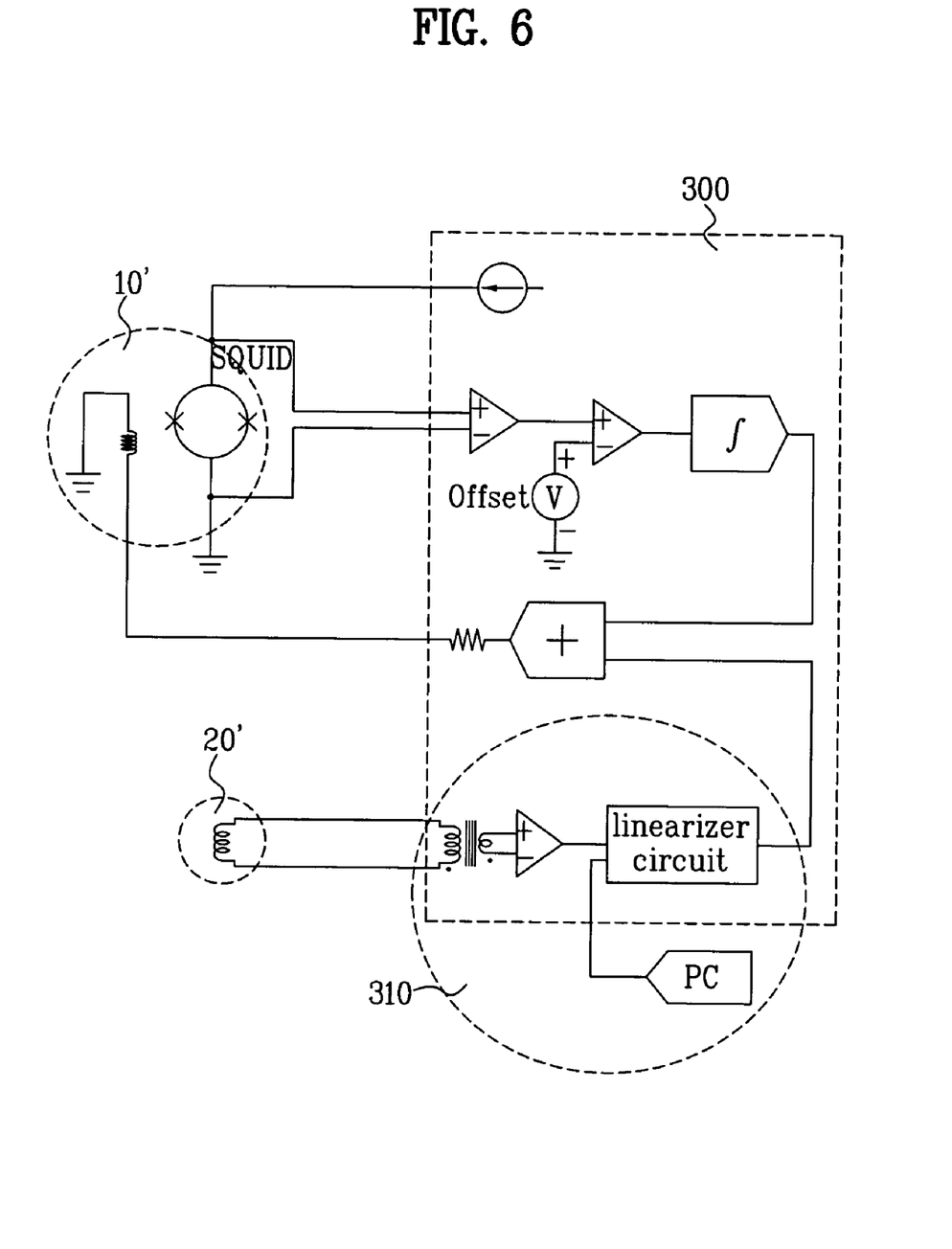
FIG. 6 is a detailed diagram illustrating a SQUID sensor using an auxiliary sensor with a refrigerator according to a fifth embodiment of the present invention.

Furthermore, in case a frequency component is not distributed over a broadband centering on a characteristic frequency in the magnetic field generated from the motor unit 130, as shown in FIG. 6, the current attenuated by a pickup coil sensor 20' and a transformer 310 matched with the characteristic frequency can be applied to the SQUID sensing unit 10 such that the offset magnetic field can be also formed without most of the noises.

In the meanwhile, even though the frequency bandwidth intended to be measured is relatively much distant away from a driving frequency of the motor unit 130, or a measured signal is buried in one tenths or hundredths of a driving noise signal of the motor unit 130, in case information can be extracted enough by an algorithm, it is enough if the magnetic field at the periphery of the SQUID does not need to be precisely offset, and instead, the magnitude of the magnetic field applied to the SQUID is maintained only within a predetermined level. Accordingly, in such a case, the same effect can be obtained even though one dimensional conversion such as a combination of a variable resistor and a variable capacitor is simply performed.

As described above, the inventive SQUID sensor using the auxiliary sensor has an effect in that the sensitivity degradation of the SQUID can be prevented even in the large magnetic field, the S/N ratio of the SQUID driving unit can be effectively significantly improved, and a further noise caused by the noise of the auxiliary sensor can be prevented.

Further, in case the inventive SQUID sensor using the auxiliary sensor has the refrigerator added thereto, the inventive SQUID sensor has an effect in that the performance degradation can be prevented at the time of driving the SQUID, and the magnetic field applied to the SQUID can be offset with the low noise due to the auxiliary sensor.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A SQUID (Superconducting QUantum Interference Device) sensor using an auxiliary sensor, comprising:
   a SQUID sensing unit having a SQUID and a first feedback coil for creating a magnetic field at a periphery of the SQUID;
   an auxiliary sensor having a lower magnetic sensitivity and a higher operation range than the SQUID sensing unit;
   a sensor reading unit for operating the SQUID sensing unit and the auxiliary sensor to read out a signal of the SQUID and at the same time, supplying the SQUID sensing unit with an offset magnetic field through the first feedback coil; and
   a combiner for combining an output of the auxiliary sensor with an output of the SQUID sensing unit to output noise-eliminated signal.

2. The SQUID sensor of claim 1, wherein the sensor reading unit comprises:
   a SQUID driving unit for driving the SQUID sensing unit to read out an output signal of the SQUID;
   an auxiliary sensor driving unit for driving the auxiliary sensor to read out the output signal of the SQUID; and
   a combining unit for combining magnetic fields generated from the SQUID driving unit and the auxiliary sensor driving unit to supply the SQUID sensing unit with combined magnetic field as the offset magnetic field through the first feedback coil.

3. The SQUID sensor of claim 2, wherein the SQUID driving unit and the auxiliary sensor driving unit receive reset values respectively to protect a SQUID value from a noise generated from the auxiliary sensor.

4. The SQUID sensor of claim 3, wherein the reset values are applied with a time lag such that after the offset magnetic field is applied, the SQUID driving unit and the auxiliary sensor driving unit are reset.

5. The SQUID sensor of claim 1, wherein the sensor reading unit combines the output signal of the SQUID with a signal generated from a second feedback coil.

6. The SQUID sensor of claim 1, wherein the sensor reading unit combines a maximum value of the magnetic field sensed by the auxiliary sensor with a signal value of the SQUID generated by an operation of the SQUID sensing unit, and applies the combined value to the SQUID sensing unit through the first feedback coil.

7. The SQUID sensor of claim 1, wherein the combiner allows a magnetic field value detected by the auxiliary sensor to be included in the output signal of the SQUID by a predetermined ratio having a negative value such that the noise-eliminated signal is outputted.

8. The SQUID sensor of claim 7, wherein the ratio is a product of an output value of the SQUID, a combination constant of the feedback coil, and a gain of the SQUID driving unit.

9. The SQUID sensor of claim 1, wherein the auxiliary sensor is comprised of a pick-up coil sensor or a transformer.

10. The SQUID sensor of claim 1, further comprising a refrigerator for continuously or frequently maintaining the SQUID sensing unit in a low temperature.

11. The SQUID sensor of claim 10, wherein the refrigerator comprises:
    a motor unit for generating a magnetic field having a permanent magnet and a fixed electro-magnet;
    a coolant for allowing a low temperature portion to be cooled by a compression, expansion process of the motor unit; and
    a cold end for transmitting the coolant to the SQUID sensing unit to maintain the SQUID sensing unit in the low temperature.

12. The SQUID sensor of claim 11, wherein the auxiliary sensor is disposed near the motor unit, and the SQUID sensing unit is disposed distant away from the motor unit.

13. A SQUID (Superconducting QUantum Interference Device) sensor using an auxiliary sensor, comprising:
    a SQUID sensing unit having a SQUID and a first feedback coil for creating a magnetic field at a periphery of the SQUID;
    an auxiliary sensor having a lower magnetic sensitivity and a higher operation range than the SQUID sensing unit;
    a sensor reading unit for operating the SQUID sensing unit and the auxiliary sensor to read out a signal of the SQUID and at the same time, supplying the SQUID sensing unit with an offset magnetic field through the first feedback coil; and
    a refrigerator for continuously or frequently maintaining the SQUID sensing unit in a low temperature, wherein the refrigerator comprises:
      a motor unit for generating a magnetic field having a permanent magnet and a fixed electro-magnet;
      a coolant for allowing a low temperature portion to be cooled by a compression, expansion process of the motor unit; and
      a cold end for transmitting the coolant to the SQUID sensing unit to maintain the SQUID sensing unit in the low temperature,
    wherein the auxiliary sensor is disposed near the motor unit, and the SQUID sensing unit is disposed distant away from the motor unit.

14. A SQUID (Superconducting QUantum Interference Device) sensor using an auxiliary sensor, comprising:
- a SQUID sensing unit having a SQUID and a first feedback coil for creating a magnetic field at a periphery of the SQUID;
- an auxiliary sensor having a lower magnetic sensitivity and a higher operation range than the SQUID sensing unit; and
- a sensor reading unit for operating the SQUID sensing unit and the auxiliary sensor to read out a signal of the SQUID and at the same time, supplying the SQUID sensing unit with an offset magnetic field through the first feedback coil, wherein the sensor reading unit comprises:
  - a SQUID driving unit for driving the SQUID sensing unit to read out an output signal of the SQUID;
  - an auxiliary sensor driving unit for driving the auxiliary sensor to read out the output signal of the SQUID; and
  - a combining unit for combining magnetic fields generated from the SQUID driving unit and the auxiliary sensor driving unit to supply the SQUID sensing unit with combined magnetic field as the offset magnetic field through the first feedback coil,
  - wherein the SQUID driving unit and the auxiliary sensor driving unit receive reset values respectively to protect a SQUID value from a noise generated from the auxiliary sensor.

15. The SQUID sensor of claim 14, wherein the reset values are applied with a time lag such that after the offset magnetic field is applied, the SQUID driving unit and the auxiliary sensor driving unit are reset.

16. A SQUID (Superconducting QUantum Interference Device) sensor using an auxiliary sensor, comprising:
- a SQUID sensing unit having a SQUID and a first feedback coil for creating a magnetic field at a periphery of the SQUID;
- an auxiliary sensor having a lower magnetic sensitivity and a higher operation range than the SQUID sensing unit; and
- a sensor reading unit for operating the SQUID sensing unit and the auxiliary sensor to read out a signal of the SQUID and at the same time, supplying the SQUID sensing unit with an offset magnetic field through the first feedback coil,
- wherein the sensor reading unit combines a maximum value of the magnetic field sensed by the auxiliary sensor with a signal value of the SQUID generated by an operation of the SQUID sensing unit, and applies the combined value to the SQUID sensing unit through the first feedback coil.

* * * * *